United States Patent
Chisaka

(10) Patent No.: US 10,205,446 B2
(45) Date of Patent: Feb. 12, 2019

(54) SEMICONDUCTOR DEVICE

(71) Applicant: KABUSHIKI KAISHA TOSHIBA, Tokyo (JP)

(72) Inventor: Junichi Chisaka, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 1 day.

(21) Appl. No.: 15/252,199

(22) Filed: Aug. 30, 2016

(65) Prior Publication Data

US 2017/0272069 A1   Sep. 21, 2017

(30) Foreign Application Priority Data

Mar. 15, 2016  (JP) .................. 2016-051326

(51) Int. Cl.
  *H03K 17/06*   (2006.01)
  *H03K 17/082*  (2006.01)
  *H03K 17/14*   (2006.01)

(52) U.S. Cl.
  CPC ....... *H03K 17/063* (2013.01); *H03K 17/0822* (2013.01); *H03K 17/145* (2013.01)

(58) Field of Classification Search
  CPC . H03K 17/063; H03K 17/0822; H03K 17/145
  USPC .................................. 327/383, 384
  See application file for complete search history.

(56) References Cited

U.S. PATENT DOCUMENTS

| | | | |
|---|---|---|---|
| 7,548,403 B2 | 6/2009 | Nagata et al. | |
| 7,759,985 B2 | 7/2010 | Yanagishima | |
| 8,013,642 B2 | 9/2011 | Nakagawa | |
| 8,299,841 B2 * | 10/2012 | Fukuhara | H03K 17/04123 327/380 |
| 8,351,168 B2 | 1/2013 | Sicard | |
| 8,373,494 B2 | 2/2013 | Soma et al. | |
| 2012/0262204 A1 * | 10/2012 | Yanase | H03K 17/04123 327/108 |

FOREIGN PATENT DOCUMENTS

| | | |
|---|---|---|
| JP | 2007-195007 | 8/2007 |
| JP | 2011-185802 A | 9/2011 |

(Continued)

OTHER PUBLICATIONS

Japanese Office Action dated May 22, 2018, filed in counterpart Japanese Patent Application No. 2016-051326 (14 pages) (with translation).

*Primary Examiner* — Lincoln Donovan
*Assistant Examiner* — Colleen O Toole
(74) *Attorney, Agent, or Firm* — Patterson & Sheridan, LLP

(57) ABSTRACT

A semiconductor device includes a gate terminal, a ground terminal, a power-supply terminal, and a source terminal. The semiconductor device includes a first switch element having a gate and a source, the first switch element connected between the gate terminal and the source terminal, a second switch element connected between one of the gate of the first switch element and the source terminal or between the gate of the first switch element and the ground terminal and configured to switch the first switch element between turned-on and turned-off states, and a capacitor having one terminal thereof connected to the power-supply terminal and the ground terminal and another terminal thereof connected to the gate of the first switch element. Based on the potential state of the ground terminal and the state of the second switch element, the capacitor boosts the voltage of the gate of the first switch element.

9 Claims, 4 Drawing Sheets

(56) References Cited

FOREIGN PATENT DOCUMENTS

| JP | 2011-199401 A | 10/2011 |
|----|---------------|---------|
| JP | 2013-527698   | 6/2013  |

* cited by examiner

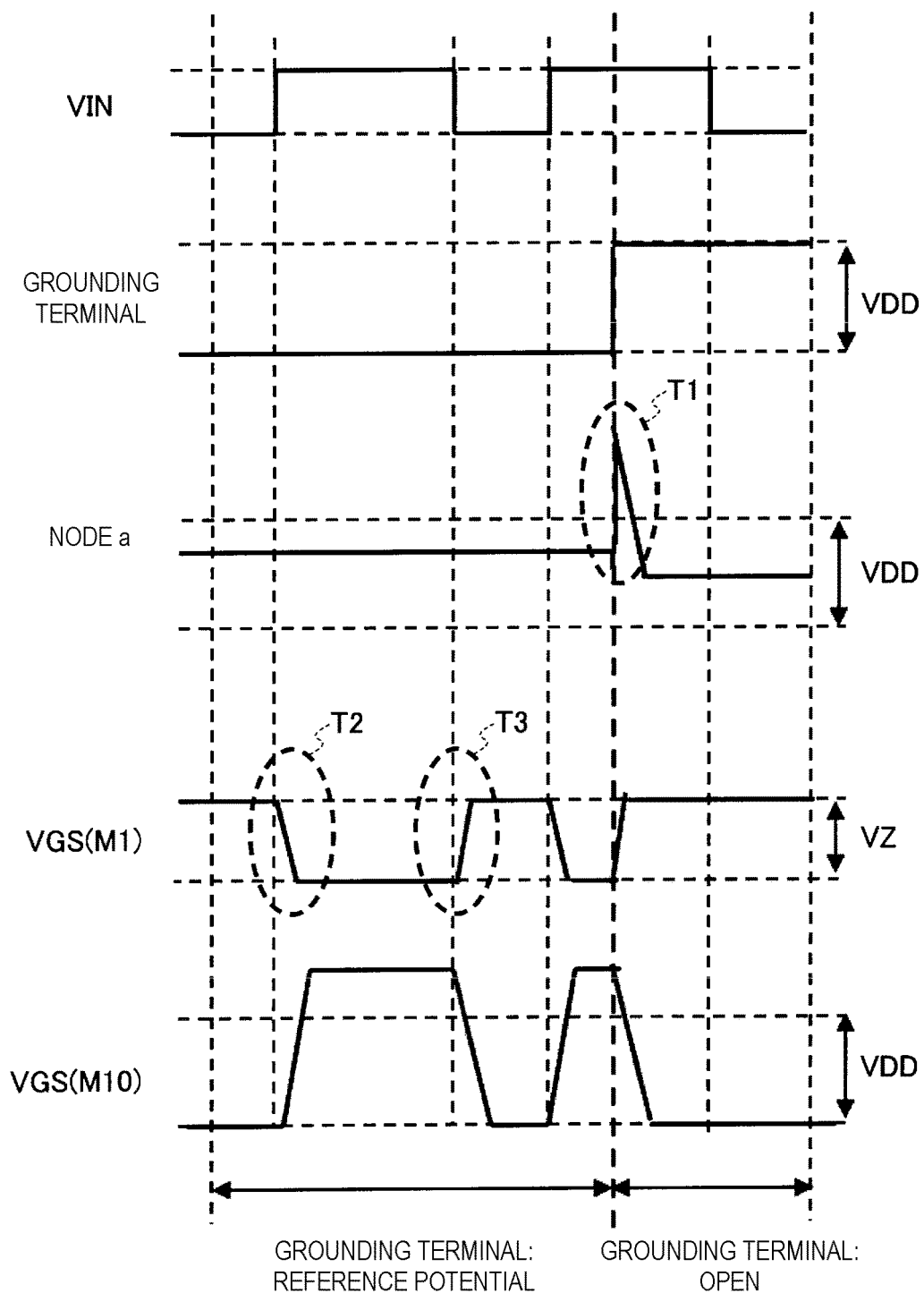

SEMICONDUCTOR DEVICE

CROSS-REFERENCE TO RELATED APPLICATION

This application is based upon and claims the benefit of priority from Japanese Patent Application No. 2016-051326, filed Mar. 15, 2016, the entire contents of which are incorporated herein by reference.

FIELD

Embodiments described herein relate generally to a semiconductor device.

BACKGROUND

In a semiconductor device that controls a metal-oxide semiconductor (MOS) transistor connected to the output of a load, when the potential of a grounding terminal changes from a reference potential to an electrically open state, a malfunction in which the semiconductor device cannot turn off the output MOS transistor may occur.

Thus, a semiconductor device in which an auxiliary MOS transistor is connected between the gate and source of the output MOS transistor is known. In this semiconductor device, when the grounding terminal has an electrically open state, the auxiliary MOS transistor turns on, thus turning off the output MOS transistor.

However, as the electrically open state of the grounding terminal raises the potential of the grounding terminal up to a power-supply voltage, it becomes difficult to cause the auxiliary MOS transistor to turn on.

DESCRIPTION OF THE DRAWINGS

FIG. 4 is a waveform chart illustrating an operation of the semiconductor device according to the second embodiment.

DETAILED DESCRIPTION

In general, according to one embodiment, a semiconductor device includes a gate terminal, a ground terminal, a power-supply terminal, and a source terminal. The semiconductor device further includes a first switch element having a gate and a source, the first switch element connected between the gate terminal and the source terminal, a second switch element connected between one of the gate of the first switch element and the source terminal or between the gate of the first switch element and the ground terminal and configured to switch the first switch element between turned-on and turned-off states, and a capacitor having one terminal thereof connected to the power-supply terminal and the ground terminal and another terminal thereof connected to the gate of the first switch element. Based on the potential state of the ground terminal and the state of the second switch element, the capacitor boosts the voltage of the gate of the first switch element.

Hereinafter, embodiments will be described with reference to the drawings. The embodiments described herein should not be construed to limit the invention.

First Embodiment

Figure 1:
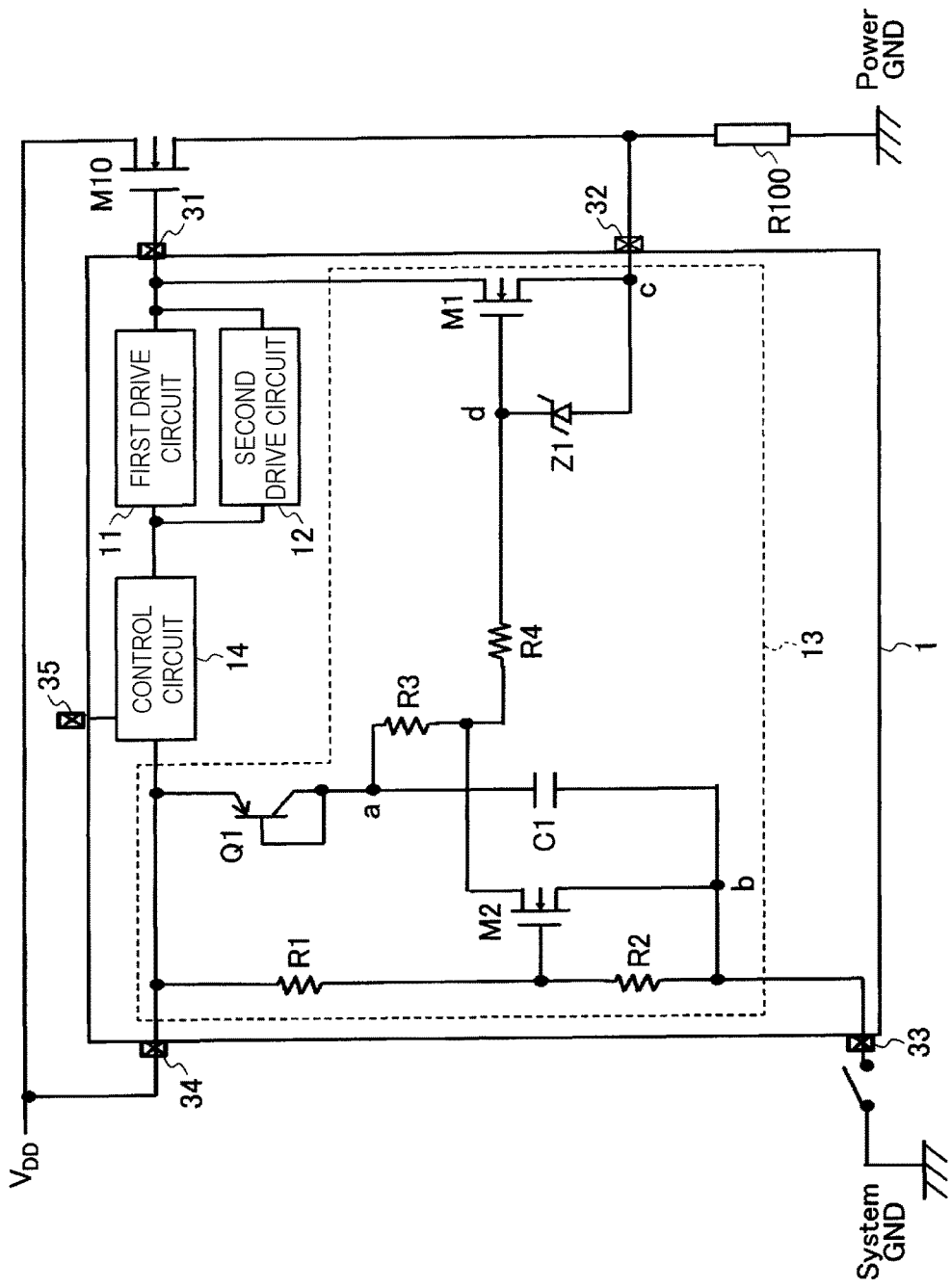
FIG. 1 is a circuit diagram illustrating a schematic configuration of a semiconductor device according to a first embodiment.

FIG. 1 is a circuit diagram illustrating a schematic configuration of a semiconductor device according to a first embodiment. A semiconductor device 1 according to the present embodiment controls a MOS transistor M10, which corresponds to an output switching element. Here, first, the MOS transistor M10 is described.

The MOS transistor M10 is configured using, for example, an N-type MOS transistor having an N-channel MOS-type gate structure. In the MOS transistor M10, a gate thereof is connected to a gate terminal 31 of the semiconductor device 1, a drain thereof is connected to a power supply (not illustrated), and a source thereof is connected to a source terminal 32 of the semiconductor device 1 and a load R100. The load R100 corresponds to, for example, a vehicle headlamp. In this case, when the MOS transistor M10 turns on, the headlamp turns on, and conversely, when the MOS transistor M10 turns off, the headlamp turns off.

Next, a configuration of the semiconductor device 1 according to the present embodiment is described. As illustrated in FIG. 1, the semiconductor device 1 according to the present embodiment includes a first drive circuit 11, a second drive circuit 12, a third drive circuit 13, and a control circuit 14.

Each of the first drive circuit 11 and the second drive circuit 12 is connected to the gate terminal 31. The first drive circuit 11 turns on the MOS transistor M10 under the control of the control circuit 14. The second drive circuit 12 turns off the MOS transistor M10 under the control of the control circuit 14.

The third drive circuit 13 includes a MOS transistor M1, a MOS transistor M2, resistor elements R1 to R4, a capacitor C1, a transistor Q1, and a Zener diode Z1. The MOS transistor M1 corresponds to a first switch element, and the MOS transistor M2 corresponds to a second switch element. Furthermore, the resistor element R1 corresponds to a first resistor element, and the resistor element R2 corresponds to a second resistor element.

The MOS transistor M1 is configured using, for example, an N-type MOS transistor as with the MOS transistor M10. The MOS transistor M1 is connected between the gate terminal 31, which is a connecting terminal to the gate of the MOS transistor M10, and the source terminal 32, which is a connecting terminal to the source of the MOS transistor M10. More specifically, the drain thereof is connected to the gate terminal 31, and the source thereof is connected to the source terminal 32. The MOS transistor M1 turns off when the potential of a grounding terminal 33 is a reference potential, and turns on when the potential of the grounding terminal 33 is in an electrically open state.

The MOS transistor M2 is also configured using, for example, an N-type MOS transistor as with the MOS transistor M10. In the MOS transistor M2, the gate thereof is connected to a power-supply terminal 34 via the resistor element R1 and is also connected to the grounding terminal 33 via the resistor element R2. The drain thereof is connected to the gate of the MOS transistor M1 via the resistor element R4. The source thereof is connected to the grounding terminal 33. The voltage between the gate and the source of the MOS transistor M2 is set by a voltage division ratio between the resistor element R1 and the resistor element R2, which are connected in series between the power-supply terminal 34 and the grounding terminal 33. The voltage division ratio is set in such a way that the MOS transistor M2 constantly turns on when the potential of the grounding terminal 33 is the reference potential.

One end of the capacitor C1 is connected to the grounding terminal 33 and is also connected to the power-supply terminal 34 via the resistor elements R1 and R2. The other end of the capacitor C1 is connected to the resistor element R3 and the transistor Q1. When the potential of the grounding terminal 33 has entered an electrically open state, the capacitor C1 boosts the gate potential of the MOS transistor M1 to a potential higher than the potential of the power-supply terminal 34, which corresponds to a power-supply voltage VDD.

The transistor Q1 is a PNP-type transistor connected between the power-supply terminal 34 and the other end of the capacitor C1. In the transistor Q1, the base and collector thereof are short-circuited. Therefore, the transistor Q1 corresponds to a diode having an anode connected to the power-supply terminal 34 and a cathode connected to the other end of the capacitor C1. The transistor Q1 prevents current from flowing back to the power-supply terminal 34 due to the boosting operation of the capacitor C1.

The Zener diode Z1 is connected between the gate and source of the MOS transistor M1. The Zener diode Z1 keeps the voltage between the gate and source of the MOS transistor M1 constant to stabilize the on-state of the MOS transistor M1.

When the potential of the grounding terminal 33 is the reference potential, the control circuit 14 controls the first drive circuit 11 and the second drive circuit 12 based on a signal input from a control terminal 35.

The operation of the semiconductor device 1 according to the present embodiment is now described. Here, the description is focused on the operation of the above-mentioned third drive circuit 13 with reference to FIG. 1 and FIG. 2.

Figure 2:
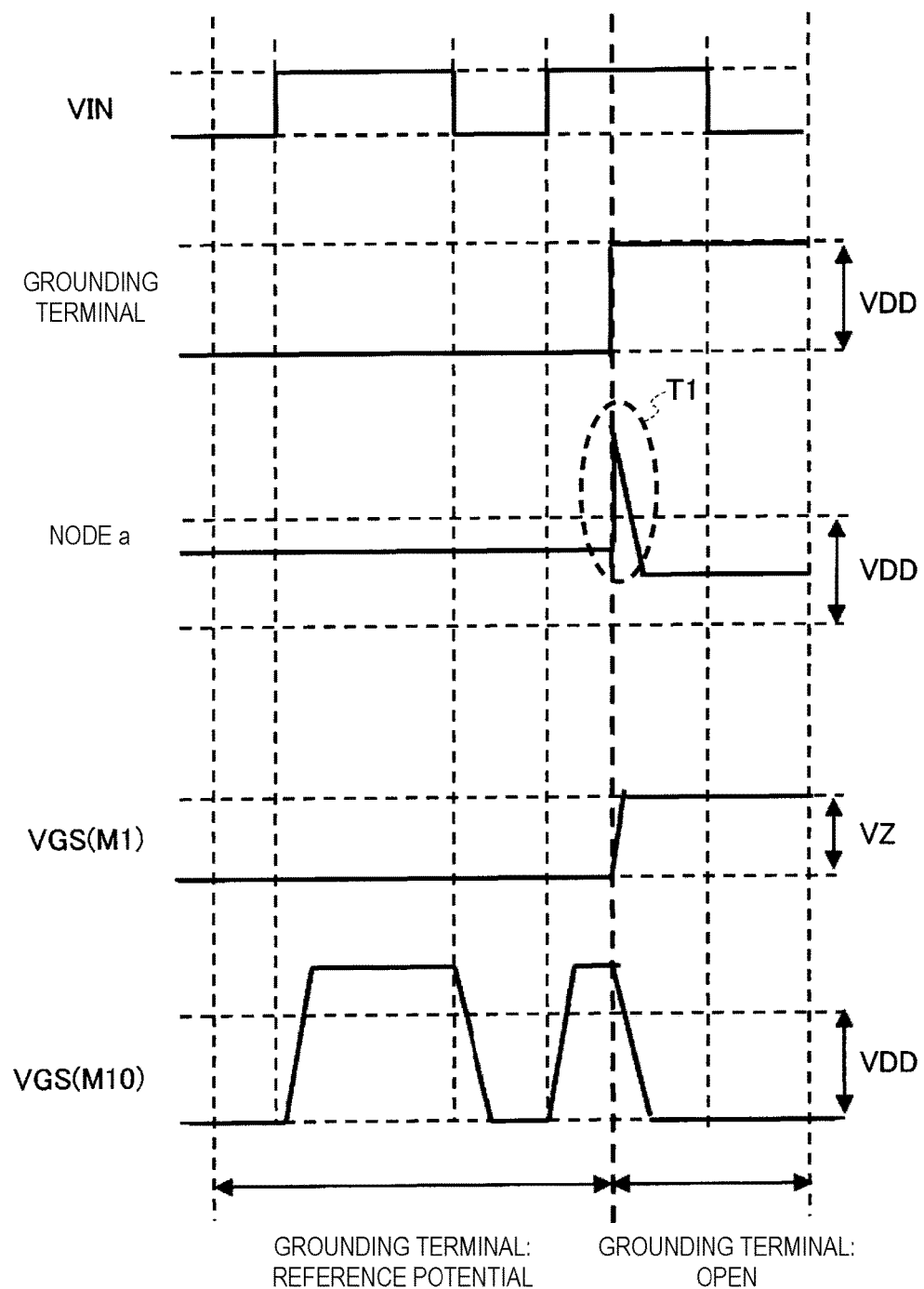
FIG. 2 is a waveform chart illustrating an operation of the semiconductor device according to the first embodiment.

FIG. 2 is a waveform chart illustrating an operation of the semiconductor device 1 according to the first embodiment. FIG. 2 illustrates a waveform taken when the potential of the grounding terminal 33 is the reference potential and a waveform taken when the potential of the grounding terminal 33 is in an electrically open state with respect to each of "VIN", "grounding terminal 33", "node a", "VGS(M1)", and "VGS(M10)".

"VIN" represents a voltage waveform of an input signal input to the input terminal 35. "Node a" represents a voltage waveform taken at the other terminal side of the capacitor C1 as illustrated in FIG. 1. "VGS(M1)" represents a voltage waveform taken between the gate and source of the MOS transistor M1. "VGS(M1)" corresponds to a voltage between a node d and a node c as illustrated in FIG. 1. "VGS(M10)" represents a voltage waveform taken between the gate and source of the MOS transistor M10.

When the potential of the grounding terminal 33 is at the reference potential, the grounding terminal 33 is connected, for example, via a harness to the ground of a system (System GND) using the semiconductor device 1. In this state, in the third drive circuit 13, an input current input from the power-supply terminal 34 flows through the resistor element R1 and the resistor element R2. As a result the gate voltage of the MOS transistor M2 rises, so that the MOS transistor M2 turns on.

When the MOS transistor M2 turns on, the potential of the node d, which corresponds to the gate potential of the MOS transistor M1, is lowered and the MOS transistor M1 turns off. Since the MOS transistor M1 is turned off, the gate potential of the MOS transistor M10 is not affected by the MOS transistor M1. Therefore, the MOS transistor M10 turns on and off in a normal way based on the input signal VIN.

Furthermore, when the MOS transistor M2 is turned on, the potential of the node a, which corresponds to the potential of the other terminal of the capacitor C1, also lowers, and no boosting operation of the capacitor C1 is performed.

When the connection between the grounding terminal 33 and the ground of the system is open, the potential of the grounding terminal 33 changes from the reference potential to an electrically open state. Such a change in potential of the grounding terminal 33 causes the current pathway leading from the power-supply terminal 34 to the resistor element R1 and the resistor element R2 to no longer occur, as the current from the power supply at the power supply terminal 34 cannot flow therethrough to ground. When this occurs, the potential of a node b, which corresponds to the potential of one terminal of the capacitor C1, rises up to the potential of the power-supply terminal 34, which corresponds to the power-supply voltage VDD.

Such a rise in potential of the node b causes a potential difference between the gate and source of the MOS transistor M2 to be almost 0 V, so that the MOS transistor M2 turns off. At this time, the potential of the node a is boosted by the charge of the capacitor C1 up to approximately "2VDD−Vbe (Q1)" (referring to a dotted line region T1 illustrated in FIG. 2). Here, "Vbe(Q1)" represents the voltage between the base and emitter of the transistor Q1.

Along with a rise in potential of the node a, the gate potential of the MOS transistor M1 also rises to a potential higher than the power-supply voltage VDD. On the other hand, the source potential of the MOS transistor M1 was already in the vicinity of the power-supply voltage VDD when the MOS transistor M10 was in an on-state. At this time, since the gate potential of the MOS transistor M1 is higher than the power-supply voltage VDD as mentioned above, when a voltage higher than a threshold voltage occurs between the gate and source of the MOS transistor M1, the MOS transistor M1 turns on. As a result, the voltage between the gate and source of the MOS transistor M10 is lowered, so that the MOS transistor M10 turns off.

After that, the gate potential of the MOS transistor M1 gradually lowers up to "VDD−Vbe(Q1)" depending on the time constant defined by the capacitor C1 and the resistor elements R3 and R4. At this time, the voltage VGS (M1) between the gate and source of the MOS transistor M1 is kept at a Zener voltage VZ by the Zener diode Z1. When the Zener voltage VZ is higher than the above-mentioned threshold voltage, the on-state of the MOS transistor M1 is stable, and the off-state of the MOS transistor M10 is also stable.

According to the above-described embodiment, when the grounding terminal 33 enters an electrically open state, the MOS transistor M2 turns off and the capacitance C1 applies a voltage higher than the power-supply voltage VDD to the gate of the MOS transistor M1. Therefore, since a voltage difference is thus generated between the gate and source of the MOS transistor M1, the MOS transistor M1 is likely to turn on. When the MOS transistor M1 turns on, the difference in potential between the gate terminal 31 and the source terminal 32 is substantially reduced and are approximately the same.

Since the gate of the MOS transistor M10 is connected to the gate terminal 31 and the source of the MOS transistor M10 is connected to the source terminal 32, the MOS transistor M10 turns off. This enables, even when the potential of the grounding terminal 33 changes from the reference potential to an electrically open state, a state in which the MOS transistor M10 becomes unable to turn off unlikely to occur.

Second Embodiment

Figure 3:
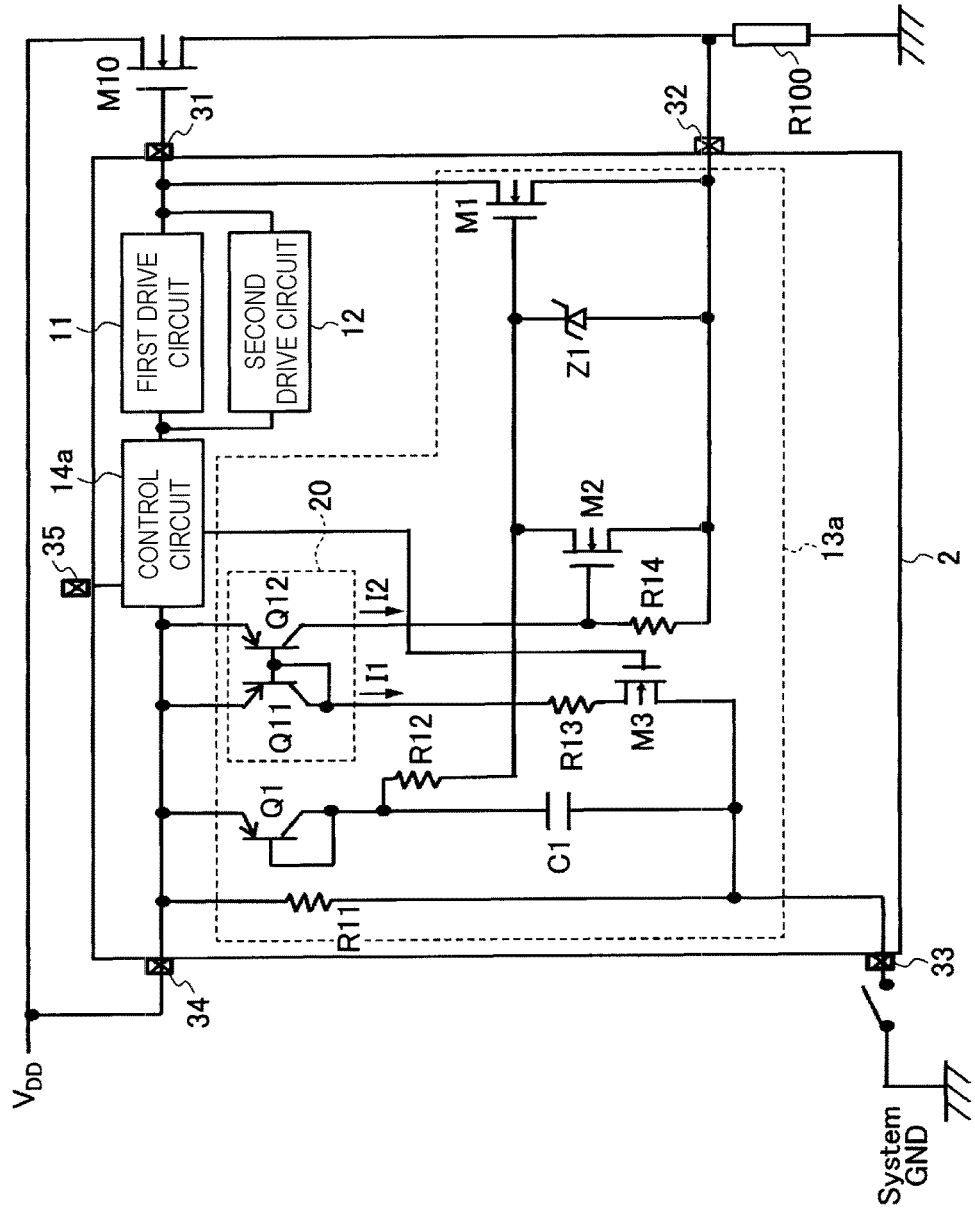
FIG. 3 is a circuit diagram illustrating a schematic configuration of a semiconductor device according to a second embodiment.

FIG. 3 is a circuit diagram illustrating a schematic configuration of a semiconductor device according to a second embodiment. As illustrated in FIG. 3, a semiconductor device 2 according to this second embodiment includes a first drive circuit 11, a second drive circuit 12, a third drive circuit 13a, and a control circuit 14a.

Since the first drive circuit 11 and the second drive circuit 12 are similar to those in the first embodiment, the description thereof is omitted, and, in the following description, the third drive circuit 13a and the control circuit 14a are described. However, the same constituent elements as those in the first embodiment are assigned the respective same reference characters, and a repeat detailed description thereof is omitted.

The third drive circuit 13a includes a current source circuit 20, MOS transistors M1 to M3, resistor elements R11 to R14, a capacitor C1, a transistor Q1, and a Zener diode Z1. The MOS transistor M3 corresponds to a third switch element.

The current source circuit 20 includes a transistor Q11 and a transistor Q12. The transistor Q11 corresponds to a fourth switch element. The transistor Q12 corresponds to a fifth switch element. The transistor Q11 and the transistor Q12 constitute a current mirror circuit having the respective bases connected to each other. In the present embodiment, the transistor Q11 and the transistor Q12 are PNP-type transistors, but can be P-type MOS transistors having a P-channel MOS-type gate structure.

In the transistor Q11, the emitter thereof is connected to the power-supply terminal 34, and the collector thereof is connected to the base thereof and is also connected to the drain of the MOS transistor M3 via the resistor element R13.

In the transistor Q12, the emitter thereof is connected to the power-supply terminal 34, and the collector thereof is connected to the gate of the MOS transistor M2 and is also connected to the source terminal 32 via the resistor element R14.

The MOS transistor M2 is connected between the gate of the MOS transistor M1 and the source terminal 32. When the MOS transistor M2 turns on, the MOS transistor M1 turns off as in the first embodiment.

In the MOS transistor M3, the gate thereof is connected to the control circuit 14a, the drain thereof is connected to the transistor Q11 via the resistor element R13, and the source thereof is connected to the grounding terminal 33. When the MOS transistor M3 turns on, current is supplied from the current source circuit 20 to the MOS transistor M2, so that the MOS transistor M2 turns on. Conversely, when the MOS transistor M3 turns off, no current is supplied from the current source circuit 20 to the MOS transistor M2, so that the MOS transistor M2 turns off. In this way, the MOS transistor M3 switches whether the current source circuit 20 and the MOS transistor M2 are electrically connected to each other.

When the potential of the grounding terminal 33 is the reference potential, the control circuit 14a controls the MOS transistor M3 as well as the first drive circuit 11 and the second drive circuit 12.

An operation of the semiconductor device 2 according to the present embodiment is described below. Here, the description is focused on operations of the above-mentioned third drive circuit 13a and control circuit 14a with reference to FIG. 3 and FIG. 4.

FIG. 4 is a waveform chart illustrating an operation of the semiconductor device 2 according to the second embodiment. As with FIG. 2, FIG. 4 also illustrates a waveform taken when the potential of the grounding terminal 33 is the reference potential and a waveform taken when the potential of the grounding terminal 33 is in an electrically open state with respect to each of "VIN", "grounding terminal 33", "node a", "VGS(M1)", and "VGS(M10)".

In the present embodiment, when the potential of the grounding terminal 33 is at the reference potential, the control circuit 14a, when causing the MOS transistor M10 to turn on, also causes the MOS transistor M3 to turn on. When the MOS transistor M3 turns on, in the current source circuit 20, a current I1 is output from the transistor Q11 and a current I2 is also output from the transistor Q12.

The current I2 causes the MOS transistor M2 to turn on. At this time, setting the current IQ12 larger than the current I1 flowing from transistor Q11 enables a voltage to be stably applied between the gate and source of the MOS transistor M2, and the MOS transistor M2 more reliably turn on.

The MOS transistor M2 turning on lowers the voltage VGS(M1) between the gate and source of the MOS transistor M1 (referring to a dotted line region T2 illustrated in FIG. 4). Thus, the MOS transistor M1 turns off.

Then, the control circuit 14a, when causing the MOS transistor M10 to turn off, also causes the MOS transistor M3 to turn off. When the MOS transistor M3 turns off, the MOS transistor M2 also turns off. With this, since the voltage VGS(M1) of the MOS transistor M1 rises, the MOS transistor M1 turns on (referring to a dotted line region T3 illustrated in FIG. 4).

Furthermore, when the potential of the grounding terminal 33 changes from the reference potential to an electrically open state, the control circuit 14a becomes unable to control the MOS transistor M3 and the source potential of the MOS transistor M3 rises, so that the MOS transistor M3 enters an off-state.

The MOS transistor M3 turning off prevents current from being supplied from the current source circuit 20 to the MOS transistor M2. Therefore, the MOS transistor M2 also enters an off-state as with the MOS transistor M3. Thus, as in the first embodiment, the stored charge in the capacitor C1 causes the gate potential of the MOS transistor M1 to rise to a potential higher than the power-supply voltage VDD, and a voltage difference is generated between the gate and source of the MOS transistor M1 (referring to a dotted line region T1 illustrated in FIG. 4). With this, the MOS transistor M1 turns on. As a result, the voltage between the gate and source of the MOS transistor M10 lowers, so that the MOS transistor M10 turns off.

According to the above-described embodiment, as in the first embodiment, when the grounding terminal 33 enters an electrically open state, since the capacitor C1 applies a voltage higher than the power-supply voltage VDD to the gate of the MOS transistor M1, the MOS transistor M1 becomes likely to turn on and the MOS transistor M10 becomes likely to turn off. Thus, when the potential of the grounding terminal 33 is in an electrically open state, a state in which the MOS transistor M10 becomes unable to turn off is unlikely to occur.

Furthermore, in the present embodiment, during a normal state in which the potential of the grounding terminal 33 is the reference voltage, when the MOS transistor M10 is in an on-state, the control circuit 14a causes the MOS transistor M3 to turn on, so that the MOS transistor M1 turns off. Thus, during the normal state, a situation in which the MOS transistor M10 becomes unable to turn on due to the MOS transistor M1 erroneously turning on is unlikely to occur.

Moreover, using the current source circuit 20 to adjust a current to be supplied to the MOS transistor M3 reduces the likelihood of the MOS transistor M10 becoming unable to turn on since, when the on-state of the MOS transistor M3 becomes stable, the off-state of the MOS transistor M1 becomes stable.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device, comprising:
    a gate terminal, a ground terminal, a power-supply terminal, and a source terminal, the ground terminal switchable between a reference potential state and an open state;
    a first switch element having gate and a source, the first switch element connected between the gate terminal and the source terminal;
    a second switch element connected between the gate of the first switch element and the source terminal and configured to switch the first switch element between turned-on and turned-off states;
    a capacitor having one terminal thereof connected to the power-supply terminal and the ground terminal and another terminal thereof connected to the gate of the first switch element, wherein, based on the potential state of the ground terminal and the state of the second switch element, the capacitor boosts the voltage of the gate of the first switch element;
    a current source circuit connected between the power-supply terminal and a gate of the second switch element;
    a third switch element connected between the ground terminal and the current source circuit; and
    a control circuit configured to control the third switch element, wherein the current source circuit comprises:
        a fourth switch element connected between the power-supply terminal and a drain of the third switch element; and
        a fifth switch element connected between the power-supply terminal and the gate of the second switch element.

2. The semiconductor device according to claim 1, further comprising:
    an output switching element having a gate connected to the gate terminal and a source connected to the source terminal, wherein
    the control circuit is configured to cause the output switching element to turn on, causing the third switch element to turn on, and, cause the output switching element to turn off, and the control circuit is configured to cause the third switch element to turn off when causing the output switching element to turn off.

3. The semiconductor device according to claim 1, wherein a current output from the fifth switch element is greater than a current output from the fourth switch element.

4. The semiconductor device according to claim 1, further comprising a Zener diode connected between the gate of the first switch element and the source of the first switch element.

5. A semiconductor device for location in a circuit between a power-supply and a load, comprising:
    a gate terminal, a source terminal, a power-supply terminal, and a ground terminal, the ground terminal switchable between a reference potential state and an open state;
    an output switching element comprising a gate and an output terminal, the gate terminal connected to the gate of the output switching element, and the source terminal connected to the output terminal of the output switching element;
    a first switch element having a gate and an output terminal and configured to selectively change the voltage at the gate terminal and the source terminal;
    a second switch element configured to change the voltage on at least the gate of the first switch element;
    a capacitor having one terminal thereof connected to the power-supply terminal and the ground terminal and another terminal thereof connected to the gate of the first switch element, wherein, based on the potential state of the ground terminal and the state of the second switch element, the capacitor boosts the voltage of the gate of the first switch element, wherein:
    a gate of the second switch element is connected to the power-supply terminal through a current source circuit and to the ground terminal through a second resistor, and
    the current source circuit comprises a first transistor and a second transistor, wherein the first transistor and the second transistor constitute a current mirror circuit having the respective bases thereof connected to each other.

6. The semiconductor device according to claim 5, wherein, when the ground terminal switches from the reference potential state to an open state, the second switch element causes the first switch element to open, and the opening of the first switch element causes the output switching element to close.

7. The semiconductor device according to claim 5, wherein the second switch element opens the first switch element to cause the capacitor to discharge and increase the voltage of the gate of the first switch element.

8. The semiconductor device according to claim 7, wherein the discharge of the capacitor increases the voltage on the gate of the first switch element to a level higher than the voltage at the power-supply terminal.

9. The semiconductor device according to claim 5, wherein the first switch element is a transistor configured to turn off when the potential of the ground terminal is at the reference potential state, and turn on when the potential of the ground terminal is in an electrically open state.

* * * * *

UNITED STATES PATENT AND TRADEMARK OFFICE
CERTIFICATE OF CORRECTION

PATENT NO. : 10,205,446 B2
APPLICATION NO. : 15/252199
DATED : February 12, 2019
INVENTOR(S) : Junichi Chisaka Page 1 of 1

It is certified that error appears in the above-identified patent and that said Letters Patent is hereby corrected as shown below:

On the Title Page

On (72) the inventor's residence "Tokyo" should be replaced with "Kawasaki Kanagawa".

Signed and Sealed this
Second Day of July, 2019

Andrei Iancu
*Director of the United States Patent and Trademark Office*